United States Patent
Kohno

(10) Patent No.: US 11,456,151 B2
(45) Date of Patent: Sep. 27, 2022

(54) IMAGE ACQUISITION METHOD AND ELECTRON MICROSCOPE

(71) Applicant: JEOL Ltd., Tokyo (JP)

(72) Inventor: Yuji Kohno, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/375,208

(22) Filed: Jul. 14, 2021

(65) Prior Publication Data
US 2022/0020561 A1 Jan. 20, 2022

(30) Foreign Application Priority Data

Jul. 15, 2020 (JP) .............................. JP2020-121320

(51) Int. Cl.
*H01J 37/28* (2006.01)
*H01J 37/147* (2006.01)
*H01J 37/22* (2006.01)

(52) U.S. Cl.
CPC .......... *H01J 37/28* (2013.01); *H01J 37/1474* (2013.01); *H01J 37/222* (2013.01); *H01J 2237/2802* (2013.01); *H01J 2237/30488* (2013.01)

(58) Field of Classification Search
CPC .. H01J 37/00; H01J 37/02; H01J 37/26; H01J 37/28; H01J 37/1474; H01J 37/222; H01J 37/265; H01J 37/147; H01J 37/1472; H01J 2237/2802; H01J 2237/30488
USPC ......................................... 250/306, 307, 311
See application file for complete search history.

(56) References Cited

U.S. PATENT DOCUMENTS

| | | | | |
|---|---|---|---|---|
| 2005/0194535 A1* | 9/2005 | Noji | ......................... | G06T 7/001 250/311 |
| 2006/0060783 A1* | 3/2006 | Armit | ...................... | H01J 37/28 250/310 |
| 2009/0032723 A1* | 2/2009 | Fukaya | ................. | H01J 37/026 250/397 |
| 2011/0249110 A1 | 10/2011 | Okai et al. | | |

(Continued)

FOREIGN PATENT DOCUMENTS

JP 2017130263 A 7/2017
WO 2017056171 A1 6/2017

OTHER PUBLICATIONS

Office Action issued in JP2020-121320 dated Jun. 7, 2022.
Extended European Search Report issued in EP21182447.9 dated Dec. 8, 2021.

*Primary Examiner* — Jason L McCormack
(74) *Attorney, Agent, or Firm* — The Webb Law Firm

(57) ABSTRACT

An image acquisition method is provided for use in an electron microscope for scanning a sample by an electron probe and acquiring a scanned image. The method includes the steps of: raster scanning a region of the sample under observation with the electron probe and obtaining a first scanned image; raster scanning the region under observation with the electron probe and obtaining a second scanned image; and superimposing the first and second scanned images over each other. In the step of obtaining the first scanned image, each one of scan lines is drawn with the electron probe in a first direction and then moved in a second direction perpendicular to the first direction. In the step of obtaining the second scanned image, each one of the scan lines is drawn with the electron probe in the first direction and then moved in a third direction opposite to the second direction.

10 Claims, 7 Drawing Sheets

(56) References Cited

U.S. PATENT DOCUMENTS

2016/0365222 A1* 12/2016 Chou ................ H01J 37/21
2017/0011883 A1   1/2017 Lev et al.
2018/0269026 A1* 9/2018 Hoque ............... H01J 37/28
2019/0279841 A1* 9/2019 Xiao ................. G01B 15/00

* cited by examiner

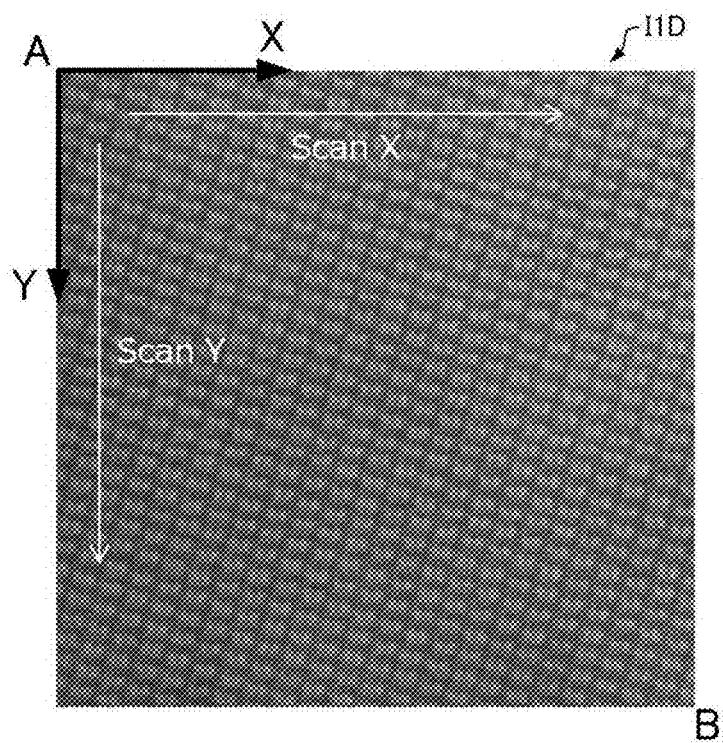
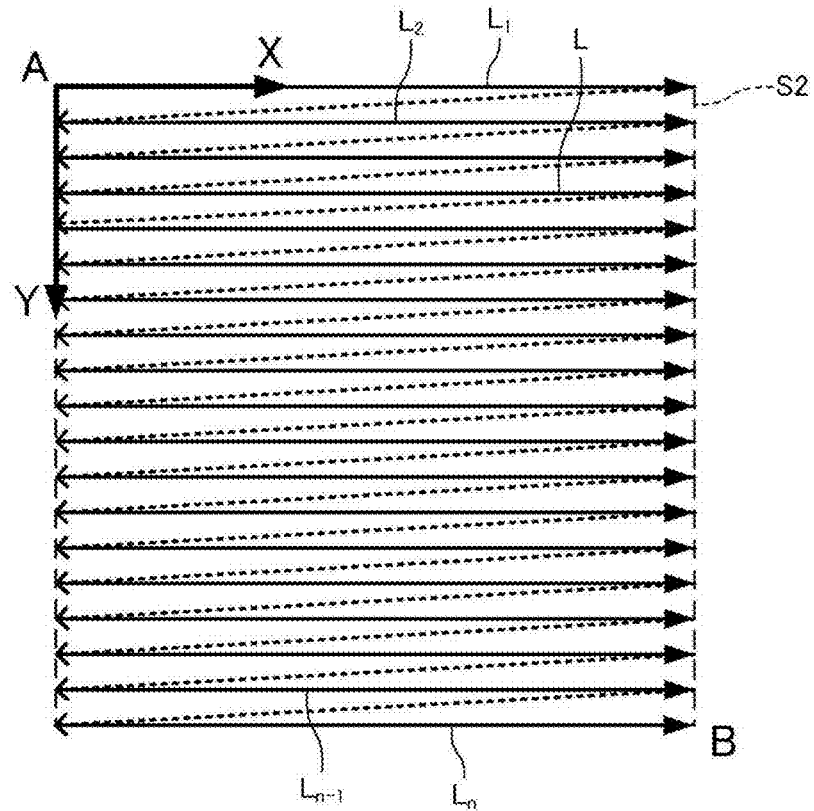
FIG.7

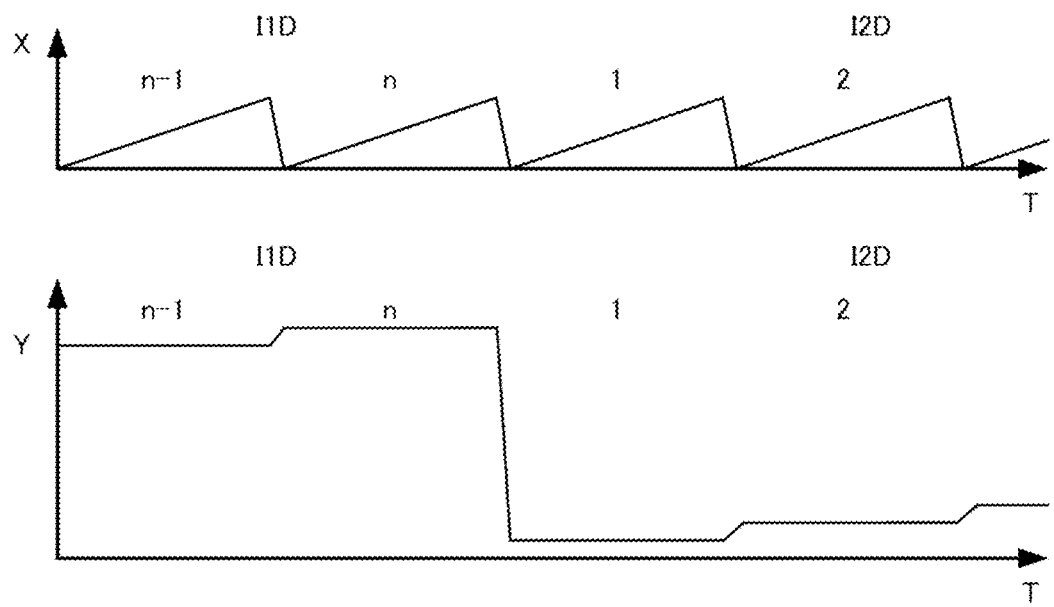
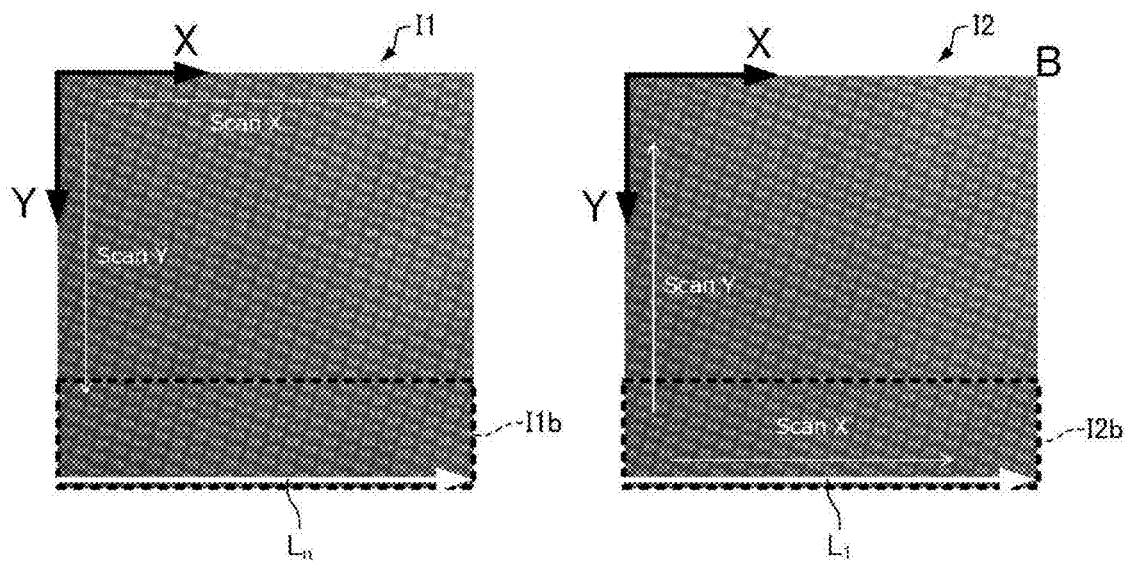
FIG.10

IMAGE ACQUISITION METHOD AND ELECTRON MICROSCOPE

CROSS-REFERENCE TO RELATED APPLICATION

This application claims priority to Japanese Patent Application No. 2020-121320 filed Jul. 15, 2020, the disclosure of which is hereby incorporated by reference in its entirety.

BACKGROUND OF THE INVENTION

1. Field of the Invention

The present invention relates to an image acquisition method and electron microscope.

2. Description of the Related Art

Electron microscopes (such as scanning transmission electron microscopes (STEMs) and scanning electron microscopes (SEMs)) are known as apparatus for acquiring images by focusing an electron beam into an electron probe and scanning a sample with the probe.

For example, a STEM image can be derived from a scanning transmission electron microscope (STEM) by scanning a sample with an electron probe, detecting either electrons transmitted through the sample or electrons scattered by the sample in synchronism with the scanning, and mapping the intensity of the resulting detection signal.

With such an electron microscope, the noise component of the image can be reduced and the quality of the image can be improved by superimposing on each other a plurality of images taken of the same region of the sample.

However, in order to derive plural images, the same region must be shot repetitively with concomitant positional deviations. Therefore, in the technique of JP-A-2017-130263, a drift correction is made to adjust the overlap position for plural images before the images are superimposed over each other.

In order to obtain a high quality image by superimposing a plurality of images over each other as described above, the images must be superimposed with high accuracy.

SUMMARY OF THE INVENTION

One aspect of the image acquisition method associated with the present invention is for use in an electron microscope for acquiring a scanned image by scanning a sample with an electron probe. This image acquisition method involves the steps of: raster scanning a region of the sample under observation with the electron probe and obtaining a first scanned image; raster scanning the region under observation with the electron probe and obtaining a second scanned image; and superimposing the first and second scanned images over each other. In the step of obtaining the first scanned image, each scan line is drawn with the electron probe in a first direction and then moved in a second direction perpendicular to the first direction. In the step of obtaining the second scanned image, each scan line is drawn with the electron probe in the first direction and then moved in a third direction opposite to the second direction.

In this method of image acquisition, the positional deviation between a second half portion of the first scanned image and a first half portion of the second scanned image can be reduced and, therefore, the positional deviation between the first and second scanned images can be corrected precisely. Consequently, in this method of image acquisition, the first and second scanned images can be superimposed over each other at high accuracy.

One aspect of the electron microscope associated with the present invention is an electron microscope for scanning a sample with an electron probe and acquiring a scanned image and comprises: an electron source emitting an electron beam; an illumination lens system for focusing the emitted electron beam into the electron probe; a deflector for deflecting the electron beam to scan the sample with the electron probe; and a controller performing processing to acquire the scanned image. The controller performs the steps of: raster scanning a region of the sample under observation with the electron probe by deflecting the electron beam by means of the deflector to thereby obtain a first scanned image; raster scanning the region under observation with the electron probe by deflecting the electron beam by means of the deflector to thereby obtain a second scanned image; and superimposing the first and second scanned images over each other. In the step of obtaining the first scanned image, each scan line is drawn with the electron probe in a first direction and then moved in a second direction perpendicular to the first direction. In the step of obtaining the second scanned image, each scan line is drawn with the electron probe in the first direction and then moved in a third direction opposite to the second direction.

In this electron microscope, the positional deviation between a second half portion of the first scanned image and a first half portion of the second scanned image can be reduced and so the positional deviation between the first and second scanned images can be corrected precisely. Accordingly, in this electron microscope, the first and second scanned images can be superimposed over each other with high accuracy.

BRIEF DESCRIPTION OF THE DRAWINGS

FIGS. 7 and 8 together illustrate a comparative example.

FIG. 9 is a waveform diagram of a scan signal used in the comparative example.

FIG. 10 illustrates a modification of the processing sequence of steps for correcting the positional deviation between the first and second STEM images.

DESCRIPTION OF THE INVENTION

The preferred embodiments of the present invention are hereinafter described in detail with the reference to the accompanying drawings. It is to be understood that the embodiments provided below are not intended to unduly restrict the contents of the present invention delineated by the claims and that not all the configurations set forth below are the essential constituent components of the invention.

1. Electron Microscope

An electron microscope associated with one embodiment of the present invention is first described by referring to FIG.

1, which shows the configuration of the electron microscope, 100, associated with the present embodiment.

The electron microscope 100 acquires a STEM image that is one example of a scanned image by scanning a sample S with an electron probe. The electron microscope 100 is a scanning transmission electron microscope. That is, the electron microscope 100 acquires a scanning transmission electron microscope (STEM) image by scanning the sample S with the electron probe, detecting either electrons transmitted through the sample S or electrons scattered by the sample S in synchronism with the scanning, and mapping the intensity of the resulting detection signal.

Figure 1:
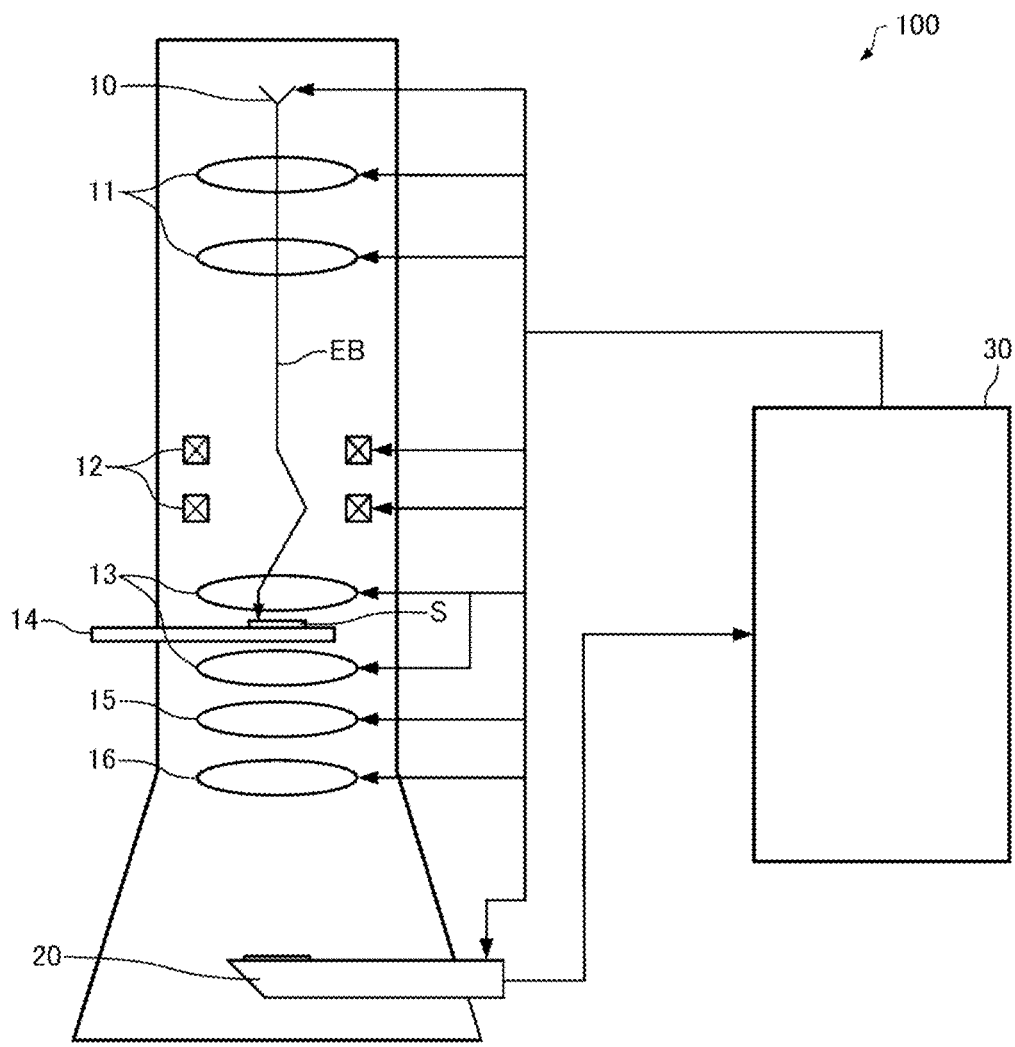
FIG. 1 is a schematic diagram of an electron microscope associated with one embodiment of the present invention, illustrating the configuration of the microscope.

As shown in FIG. 1, the electron microscope 100 includes an electron source 10, an illumination lens system 11, a scanning deflector 12, an objective lens 13, a sample stage 14, an intermediate lens 15, a projector lens 16, a detector 20, and a controller 30.

The electron source 10 produces an electron beam EB. For example, the electron source 10 is an electron gun which has a cathode for releasing electrons and an anode for accelerating the released electrons to thereby emit the electron beam EB.

The illumination lens system 11 focuses the electron beam EB produced from the electron source 10. The scanning deflector 12 deflects the electron beam EB released from the electron source 10. The focused electron beam EB, i.e., an electron probe, can be scanned over the sample S by operating the scanning deflector 12.

The objective lens 13 focuses the electron beam EB onto the sample S. The electron probe can be formed by focusing the electron beam EB with the illumination lens system 11 and the objective lens 13. Electrons transmitted through the sample S are brought to a focus by the objective lens 13.

The sample stage 14 holds the sample S and can move the sample S horizontally or vertically or tilt it. The intermediate lens 15 is located behind (i.e., downstream of) the objective lens 13. The projector lens 16 is located behind the intermediate lens 15. The objective lens 13, intermediate lens 15, and projector lens 16 together constitute the imaging system of the electron microscope 100. Either electrons transmitted through the sample S or electrons scattered by the sample S are guided to the detector 20 by the imaging system.

The detector 20 detects the electrons which are transmitted through the sample S and guided by the imaging system. The detector 20 may be an annular dark field detector for detecting the electrons scattered by the sample S. Consequently, the electron microscope 100 can generate high angle angular dark field (HAADF) STEM images.

The controller 30 controls various portions (e.g., the scanning deflector 12) of the electron microscope 100. For example, the controller 30 includes a CPU (central processing unit) and storage devices such as a RAM (random access memory), a ROM (read only memory), and so on. The controller 30 performs various calculational operations and various control operations by executing, with the CPU, programs stored in the storage devices.

2. Image Acquisition Method

Figure 2:
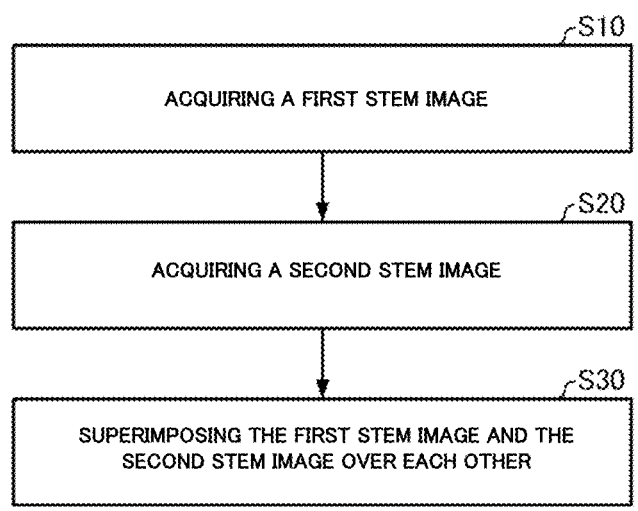
FIG. 2 is a flowchart illustrating one example of an image acquisition method for use in the electron microscope shown in FIG. 1.

The electron microscope 100 can acquire a STEM image that is one example of a scanned image. FIG. 2 is a flowchart illustrating one example of the image acquisition method for use in the electron microscope 100.

The image acquisition method for use in the electron microscope 100 involves the steps of raster scanning a region of the sample S under observation and obtaining a first scanned image (S10), raster scanning the region of the sample S under observation and obtaining a second scanned image (S20), and superimposing the first and second scanned images over each other (S30). During the step S10 for obtaining the first scanned image, each scan line is drawn with the electron probe in a first direction and then moved in a second direction perpendicular to the first direction. During the step S20 for obtaining the second scanned image, each scan line is drawn with the electron probe in the first direction and then moved in a third direction opposite to the second direction. The image acquisition method for use in the electron microscope 100 is hereinafter described in detail.

Figure 3:
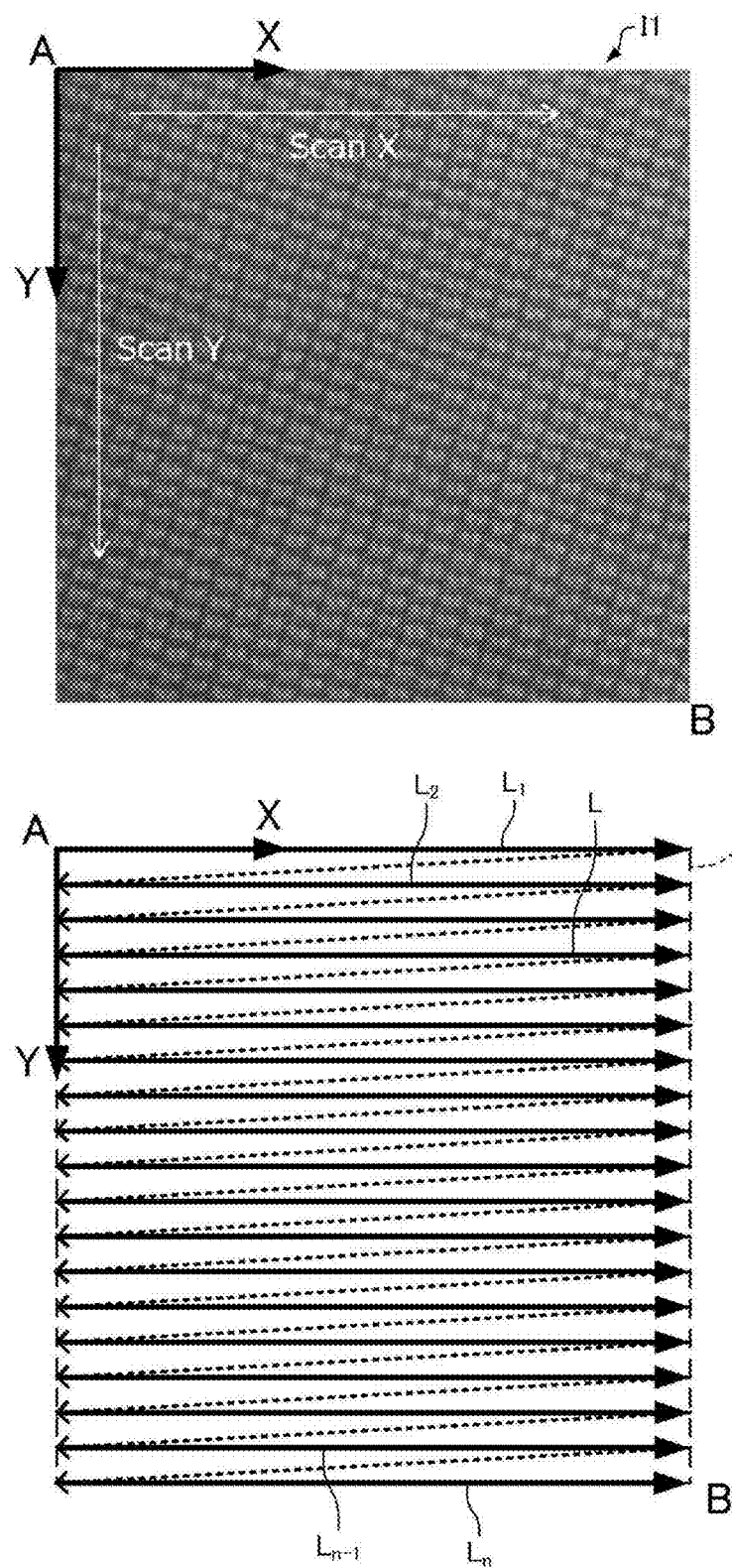
FIGS. 3 and 4 together illustrate the image acquisition method illustrated in FIG. 2.
Figure 4:
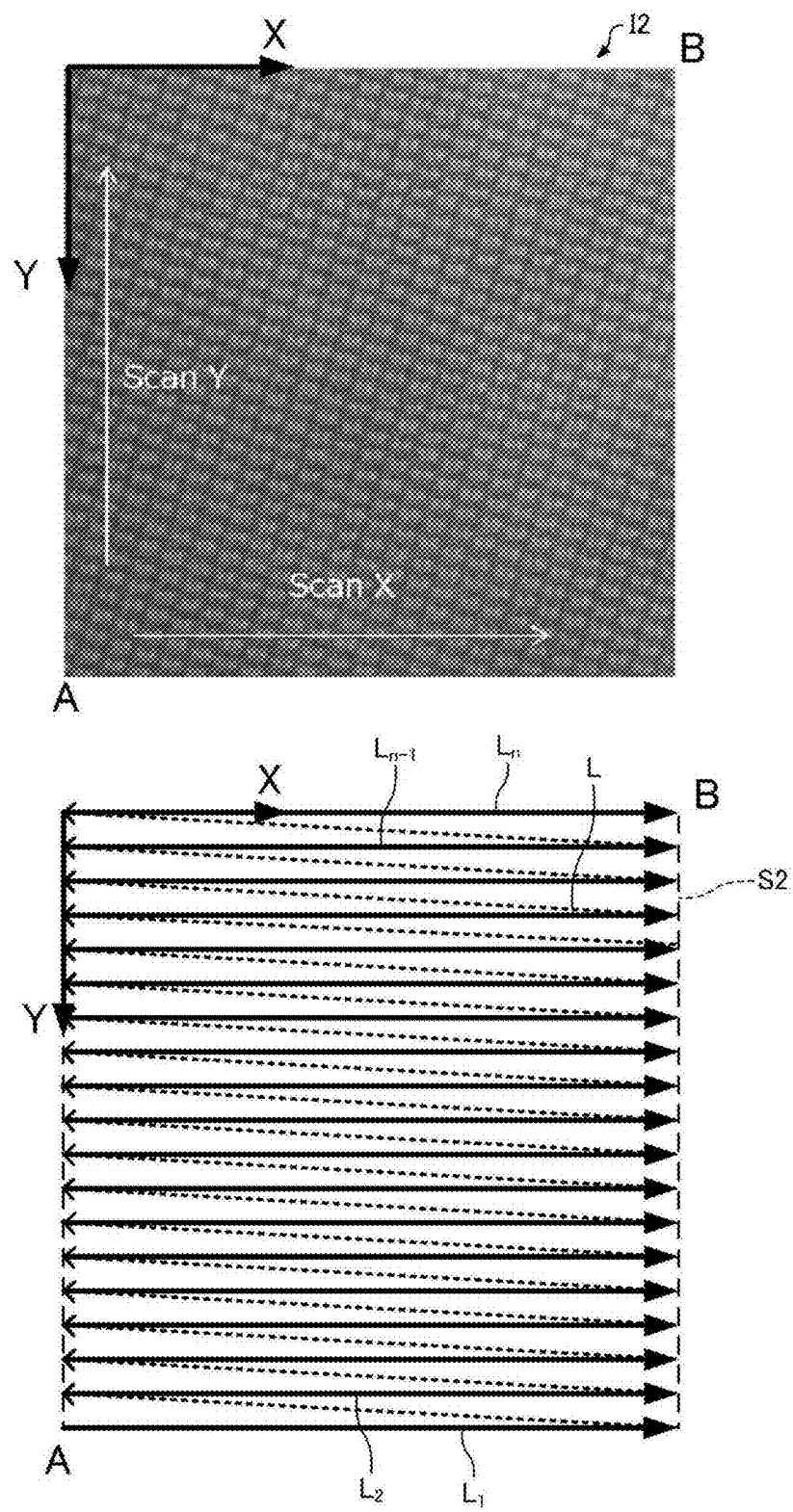

FIGS. 3 and 4 illustrate the image acquisition method for use in the electron microscope 100. FIG. 3 illustrates a first STEM image I1 and the manner in which an electron probe is scanned to obtain the first STEM image I1. FIG. 4 illustrates a second STEM image I2 and the manner in which the electron probe is scanned to obtain the second STEM image I2.

Figure 5:
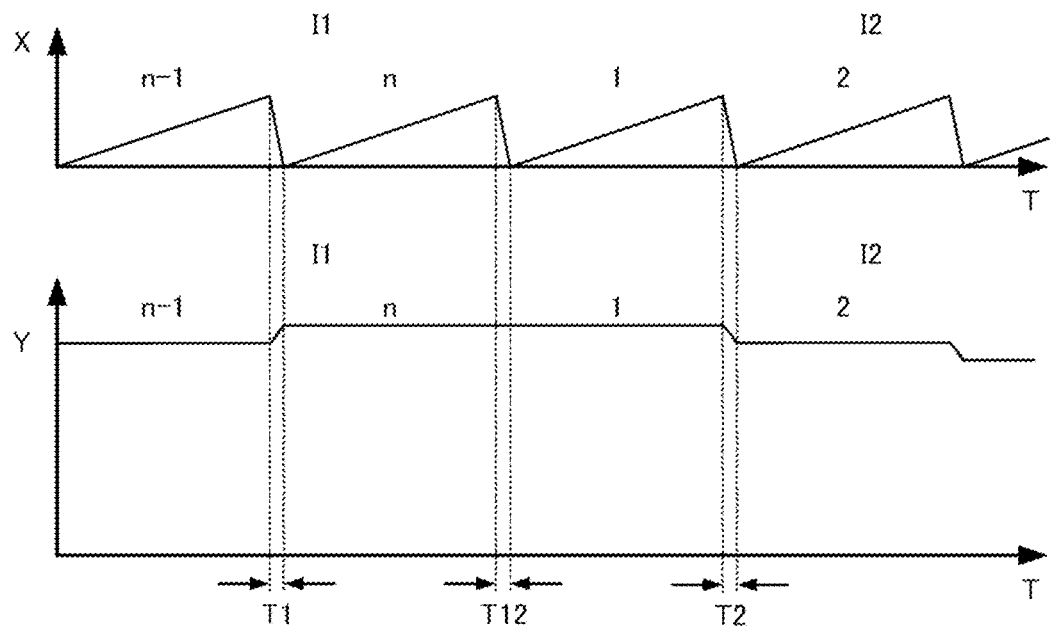
FIG. 5 is a waveform diagram of a scan signal.

FIG. 5 is a waveform diagram of a scan signal for scanning the electron probe as shown in FIGS. 3 and 4. In FIG. 5, there is shown the scan signal from when the (n−1)th scan line $L_{n-1}$ of the first STEM image I1 is drawn until the second scan line $L_2$ of the second STEM image I2 is drawn. In this example, each of the first STEM image I1 and the second STEM image I2 is obtained by drawing n scan lines L.

2.1. Acquisition of First STEM Image (S10)

First, as shown in FIG. 3, a region S2 of the sample S under observation is raster scanned and the first STEM image I1 is obtained.

During the raster scanning for obtaining the first STEM image I1, each scan line L is drawn with the electron probe in the positive X direction and then moved in the positive Y direction. That is, one scan line L is drawn by moving the electron probe in the positive X direction, and the position at which the scan line L is drawn is moved in the positive Y direction. This process is repeated to scan the region S2 under observation. The scanning of the electron probe for obtaining the first STEM image I1 starts at a position A lying at the left top end of the image, and ends at a position B lying at the right bottom end of the image.

During the scanning of the electron probe for obtaining the first STEM image I1, the time T1 taken from the drawing of each one of the scan lines L to the drawing of a next one scan line L is constant. Also, the time taken to draw each one scan line L is constant.

2.2. Acquisition of Second STEM Image (S20)

Then, as shown in FIG. 4, the region S2 under observation is raster scanned to acquire the second STEM image I2.

During the raster scanning for acquiring the second STEM image I2, each scan line L is drawn with the electron probe in the positive X direction and then moved in the negative Y direction. That is, one scan line L is drawn by moving the electron probe in the positive X direction, and the position at which the scan line L is drawn is moved in the negative Y direction. This process is repeated to scan the region S2 under observation. The scanning of the electron probe for obtaining the second STEM image I2 starts at a position A lying at the left bottom end of the image, and ends at a position B lying at the right top end of the image.

In this way, in the step of acquiring the first STEM image I1, each scan line L is moved in the positive Y direction. In the step of acquiring the second STEM image I2, each scan line L is moved in the negative Y direction. Consequently, the electron probe does not move in the Y direction during a time interval T12 from when the final (nth) scan line $L_n$ is drawn in the step S10 of obtaining the first STEM image I1 to when the initial (first) scan line $L_1$ is drawn in the step S20 of obtaining the second STEM image I2.

The position at which the final scan line $L_n$ is drawn in the step of obtaining the first STEM image I1 and the position at which the initial scan line $L_1$ is drawn in the step of obtaining the second STEM image I2 are identical. Similarly, the position at which the (n−1)th scan line $L_{n-1}$ is drawn in the step of obtaining the first STEM image I1 and the position at which the second scan line $L_2$ is drawn in the step of obtaining the second STEM image I2 are identical.

During the scanning of the electron probe for obtaining the second STEM image I2, the time T2 taken from when each one of the scan lines L is drawn to when a next one scan line L is drawn is constant. For example, T1=T2.

As illustrated in FIG. 5, the step S10 of obtaining the first STEM image I1 and the step S20 of obtaining the second STEM image I2 are performed in succession.

For example, the time T12 taken from when the final scan line $L_n$ is drawn in the step S10 of obtaining the first STEM image I1 to when the initial scan line $L_1$ is drawn in the step S20 of obtaining the second STEM image I2 is equal to the time T1 taken from when each one of the scan lines L is drawn in the step of obtaining the first STEM image I1 to when a next one scan line L is drawn (i.e., T12=T1). In the example shown in FIG. 5, T12=T1=T2.

The requirement T12=T1 is not essential if the step S10 of obtaining the first STEM image I1 and the step of obtaining the second STEM image I2 are performed in succession. For example, the time T12 may be roughly equal to the time T1.

2.3. Superimposition (S30)

Then, the first STEM image I1 and the second STEM image I2 are superimposed over each other. The step S30 of superimposing the first STEM image I1 and the second STEM image I2 includes correcting the positional deviation between the first STEM image I1 and the second STEM image I2, correcting the distortions in the first STEM image I1 and the second STEM image I2, and superimposing on each other the first STEM image I1 and the second STEM image I2 which have been corrected for positional deviation and distortion.

2.3.1. Correction of Positional Deviation

Figure 6:
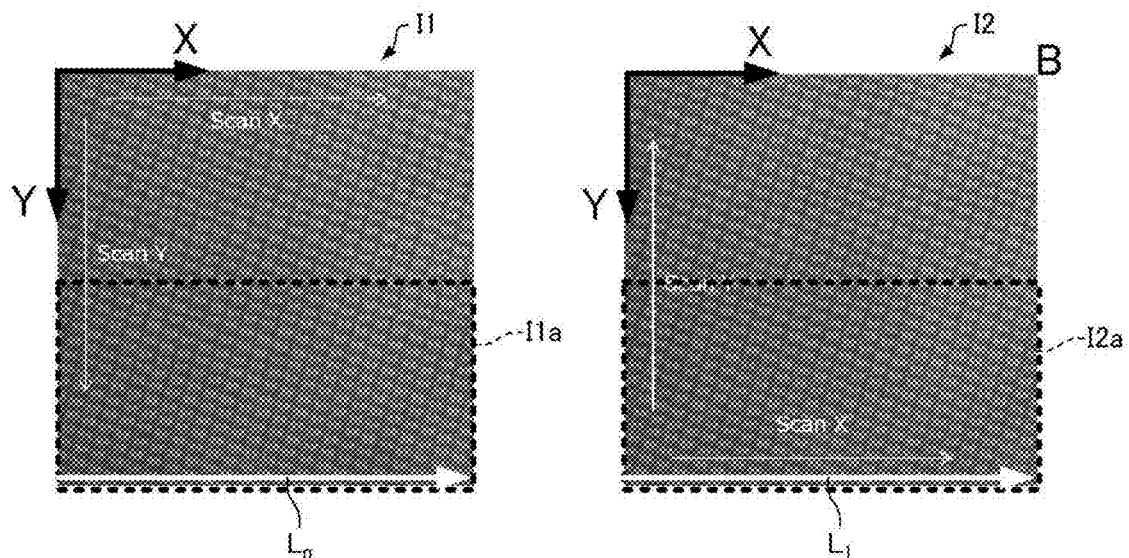
FIG. 6 illustrates processing steps for correcting the positional deviation between first and second STEM images.

FIG. 6 illustrates the operational step of correcting the positional deviation between the first STEM image I1 and the second STEM image I2. This operational step is performed by the use of a second half portion I1a of the first STEM image I1 and a first half portion I2a of the second STEM image I2. If the first STEM image I1 is separated into two half portions along the Y axis, the second half portion I1a of the first STEM image I1 is the half portion derived later. In the illustrated example, the second half portion I1a of the first STEM image I1 is the lower half of the first STEM image I1 If the second STEM image I2 is divided into two halves along the Y axis, the above-described first half portion I2a of the second STEM image I2 is the half portion derived earlier. In the illustrated example, the first half portion I2a of the second STEM image I2 is the lower half of the second STEM image I2.

The correction of the positional deviation between the first STEM image I1 and the second STEM image I2 is made, for example, by searching the second half portion I1a of the first STEM image I1 and the first half portion I2a of the second STEM image I2 for the (relative) positions of indicia indicative of the same location on or in the sample S. The positional deviation can be corrected by bringing the positions of the indicia in these two images I1 and I2 into coincidence with each other.

If the second half portion I1a of the first STEM image I1 has a plurality of indicia, there is used the indicium closest to the part of the second half portion I1a of the first STEM image I1 which has been generated by drawing the last scan line $L_n$. That is, the position of the indicium closest to the part of the second half portion I1a of the first STEM image I1 which has been generated by drawing the last scan line $L_n$ is found, and then the position of this indicium in the second STEM image I2 is found.

Where there are a plurality of indicia, the position of the indicium closest to the part of the first half portion I2a of the second STEM image I2 which has been generated by drawing the initial scan line $L_1$ may be used. That is, the position of the indicium closest to the portion of the first half portion I2a of the second STEM image I2 which has been generated by drawing the initial scan line $L_1$ is found, and then the position of this indicium in the first STEM image I1 is found.

In the step of correcting the positional deviation between the first STEM image I1 and the second STEM image I2, a cross-correlation function for the second half portion I1a of the first STEM image I1 and the first half portion I2a of the second STEM image I2 may be computed, and the positional deviation may be corrected based on the result of the computation. At this time, a cross-correlation function for a part of the second half portion I1a of the first STEM image I1 and a part of the first half portion I2a of the second STEM image I2 may be computed. It is assumed that the region for which the cross-correlation function is computed includes the region of the first STEM image I1 generated by drawing the final scan line $L_n$, its vicinities, the region of the second STEM image I2 generated by drawing the initial scan line $L_1$, and its vicinities.

The positional deviation Δ of the portion of the second STEM image I2 generated by drawing the initial scan line $L_1$ is caused by drifts of the first STEM image I1 and the second STEM image I2 and given by $$\Delta = \vec{D} \times T_L \qquad (1)$$

where $\vec{D}$ is the drift rate in nm/μs and $T_L$ is the time (in μs) taken to draw one scan line. It can also be said that the positional deviation Δ given in Eq. (1) is the positional deviation between the portion of the first STEM image I1 generated by drawing the last scan line $L_n$ and the portion of the second STEM image I2 generated by drawing the initial scan line $L_1$.

In this way, the positional deviation Δ is suppressed to the product of the drift rate $\vec{D}$ and the time taken to draw one scan line L. Accordingly, as mentioned above, the positional deviation Δ can be found precisely by using either the indicium closest to the portion of the second STEM image I2 generated by drawing the initial scan line $L_1$ or the indicium closest to the portion of the first STEM image I1 generated by drawing the last scan line $L_n$.

As described above, in the image acquisition method for use in the electron microscope 100, it is possible to make the positional deviation Δ quite small. Therefore, it can be assumed that there is no positional deviation between the portion of the first STEM image I1 generated by drawing the last scan line $L_n$ and the portion of the second STEM image I2 generated by drawing the initial scan line $L_1$.

Accordingly, when the last generated portion of the first STEM image I1 produced by drawing the last scan line $L_n$ and the initially generated portion of the second STEM image I2 produced by drawing the initial scan line $L_1$ are superimposed over each other, these two generated portions substantially agree. Consequently, a precise alignment of the first STEM image I1 and the second STEM image I2 can be achieved by aligning these two images I1 and I2 based on the two generated portions.

2.3.2. Correction of Distortions

During the step of superimposing the first STEM images I1 and the second STEM image I2 over each other, an amount of drift is computed based on these first and second STEM images I1, I2, and distortions in the STEM images I1 and I2 are corrected based on the amount of drift.

The distortion in the first STEM image I1 is given by $$\vec{P} = \vec{P}_0 + \vec{D} \times T_L \times P_y \quad (2)$$

where $\vec{P}$ is a position vector indicating a reference point in the first STEM image I1 and $\vec{P}_0$ is a position vector indicating a reference point in the absence of drift. In the lattice image shown in FIG. 3, each of the position vectors $\vec{P}$ and $\vec{P}_0$ represents a lattice vector. $P_y$ is the Y component of the position vector $\vec{P}$. In Eq. (2), it is assumed that the X component of the position vector $\vec{P}$ is negligible.

The distortion in the second STEM image I2 is given by $$\vec{P}' = \vec{P}_0 - \vec{D} \times T_L \times P'_y \quad (3)$$

where $\vec{P}'$ is a position vector indicating a reference point in the second STEM image I2 and $P'_y$ is the Y component of the position vector $\vec{P}'$. In the lattice image shown in FIG. 4, each of the position vectors $\vec{P}$ and $\vec{P}_0$ represents a lattice vector. In Eq. (3), it is assumed that the X component of the position vector P' is negligible.

As represented by Eqs. (2) and (3) above, image drifting distorts the first STEM image I1 and the second STEM image I2 in mutually opposite directions. Therefore, the drift rate $\vec{D}$, i.e., the amount of drift, can be found from the difference in distortion between the first STEM image I1 and the second STEM image I2.

In this way, the amount of drift can be found from Eqs. (2) and (3) above. Also, the distortions in the first STEM image I1 and the second STEM image I2 can be found from the amount of drift. The distortion in the first STEM image I1 can be corrected based on the found distortion in the first STEM image I1. Also, the distortion in the second STEM image I2 can be corrected based on the found distortion in the second STEM image I2.

2.3.3. Superimposition

The first STEM image I1 and the second STEM image I2 which have been corrected for positional deviation and distortion are superimposed over each other. In consequence, the first STEM image I1 and the second STEM image I2 can be superimposed at high accuracy. As a result, an accumulation image in which the first STEM image I1 and the second STEM image I2 have been accumulated can be obtained.

3. Processing of Controller

In the electron microscope 100, the controller 30 derives STEM images (accumulation image) by the above-described image acquisition method. In particular, the controller 30 performs the steps of: causing the scan deflector 12 to deflect the electron beam EB to thereby raster scan the region S2 under observation with the electron probe, thus deriving the first STEM image I1; causing the scan deflector 12 to deflect the electron beam EB to thereby raster scan the region S2 under observation with the electron probe, thus deriving the second STEM image I2; and superimposing the first STEM image I1 and the second STEM image I2 over each other. During the step of acquiring the first STEM image I1, each scan line L is drawn with the electron probe in the positive X direction and then moved in the positive Y direction. During the step of acquiring the second STEM image I2, each scan line L is drawn with the electron probe in the positive X direction and then moved in the negative Y direction.

Furthermore, the controller 30 performs the step of acquiring the first STEM image I1 and the step of acquiring the second STEM image I2 in succession. As illustrated in FIG. 5, the controller 30 makes the time T12 taken from when the final scan line $L_n$ is drawn in the step of acquiring the first STEM image I1 to when the initial scan line $L_n$ is drawn in the step of acquiring the second STEM image I2 equal to the time T1 taken from when each one scan line L is drawn to when a next one scan line L is drawn in the step of acquiring the first STEM image I1.

In the operational step of superimposing the first STEM image I1 and the second STEM image I2 over each other, the controller 30 corrects the positional deviation between these STEM images I1 and I2 through the use of the second half portion I1a of the first STEM image I1 and the first half portion I2a of the second STEM image I2 by the technique set forth in the foregoing "2.3.1. Correction of Positional Deviation".

In the operational step of superimposing the first STEM image I1 and the second STEM image I2 over each other, the controller 30 computes an amount of drift based on these two STEM images I1 and I2 and corrects the distortions in these two STEM images I1 and I2 based on the amount of drift by the technique set forth in the foregoing "2.3.2. Correction of Distortions".

The controller 30 creates a STEM image (accumulation image) by superimposing on each other the first STEM image I1 and the second STEM image I2 which have been corrected for positional deviation and distortion.

4. Functions and Effects

The image acquisition method for use in the electron microscope 100 includes the operational step of acquiring the first STEM image I1, and during this step, each scan line L is drawn with the electron probe in the positive X direction and then moved in the positive Y direction. The method also includes the operational step of acquiring the second STEM image I2, and during this step, each scan line L is drawn with the electron probe in the positive X direction and then moved in the negative Y direction. Therefore, in the image acquisition method for use in the electron microscope 100, the first STEM image I1 and the second STEM image I2 can be superimposed over each other at high accuracy. Consequently, a high quality STEM image (accumulation image) can be obtained.

Furthermore, in the image acquisition method for use in the electron microscope 100, the operational step of acquiring the first STEM image I1 and the operational step of acquiring the second STEM image I2 are performed in succession. For example, the time T12 taken from when the last scan line $L_n$ is drawn in the step of acquiring the first STEM image I1 to when the initial scan line $L_1$ is drawn in the step of acquiring the second STEM image I2 is equal to the time T1 taken from when each one scan line L is drawn to when a next one scan line L is drawn in the step of acquiring the first STEM image I1.

Figure 8:
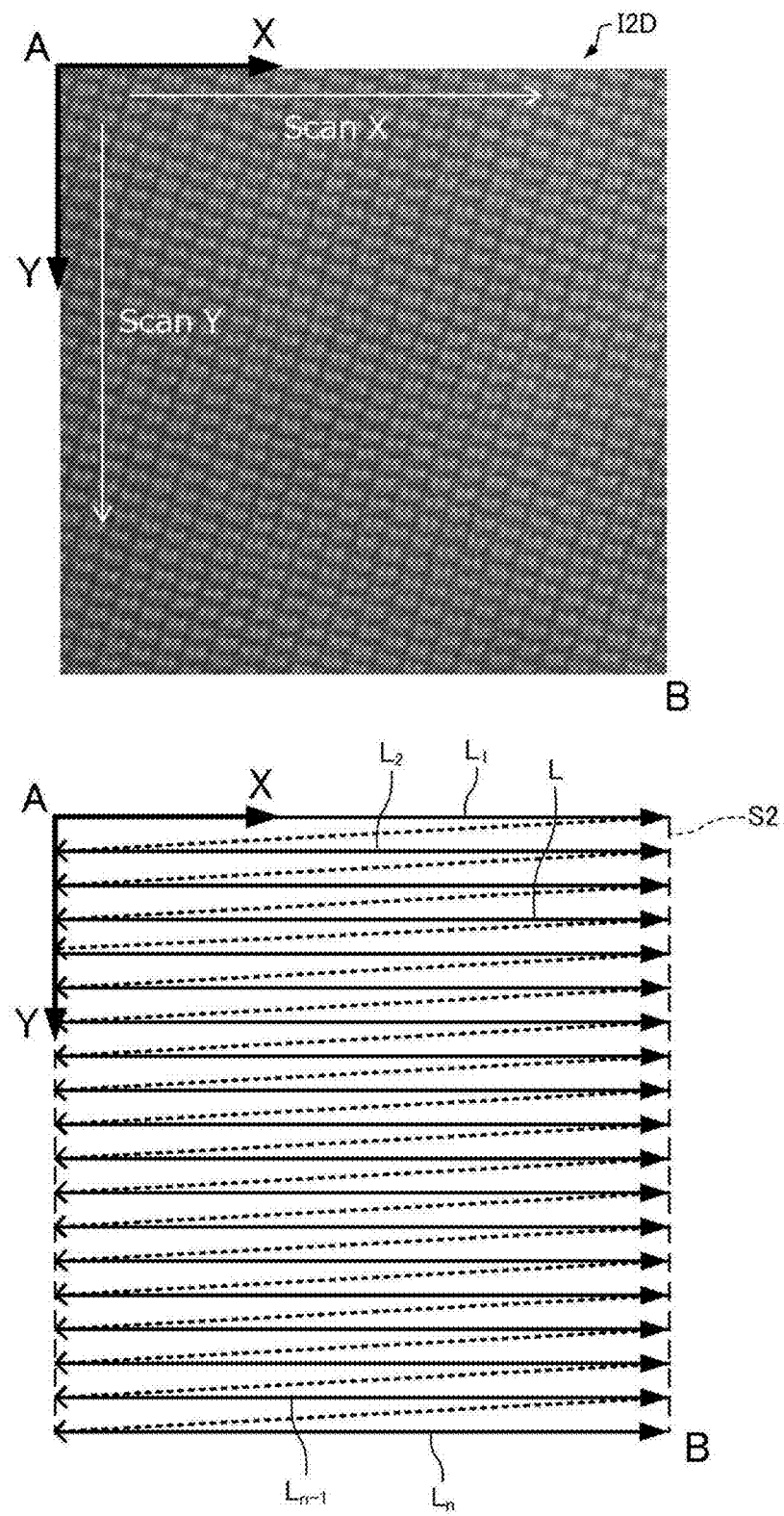

The functions and effects of the image acquisition method for use in the electron microscope 100 are next described in comparison to a comparative example. FIGS. 7 and 8 illustrate the comparative example. FIG. 7 shows a first STEM image I1D and a diagram illustrating scanning of an electron probe to acquire the first STEM image I1D. FIG. 8 shows a second STEM image I2D and a diagram illustrating scanning of an electron probe to acquire the second STEM image I2D.

FIG. 9 is a waveform diagram showing a scan signal for scanning of the electron probe shown in FIGS. 7 and 8. In FIG. 9, there is shown the scan signal from when the (n−1)th scan signal $L_{n-1}$ of the first STEM image I1D is drawn until the second scan line $L_2$ of the second STEM image I2D is drawn.

As shown in FIG. 7, in the comparative example, the region S2 under observation is first raster scanned and the first STEM image I1D is derived in the same manner as the raster scanning already described in connection with FIG. 3 to acquire the first STEM image I1.

Then, as shown in FIG. 8, the region S2 under observation is raster scanned and the second STEM image I2D is acquired in the same manner as the raster scanning for obtaining the first STEM image I1D. Then, the first STEM image I1D and the second STEM image I2D are superimposed over each other. As a result of the processing sequence described above, there can be obtained an accumulation image where the first STEM image I1D and the second STEM image I2D have been accumulated.

In the comparative example, the positional deviation Δ of the portion of the second STEM image I2D generated by drawing the initial scan line $L_1$ is caused by image drifting of the first STEM image I1D and the second STEM image I2D and given by $$\Delta = \vec{D}(T_L \times N_L + T_I) \qquad (4)$$

where $N_L$ is the number of scan lines and $T_I$ is the time (in μs) taken to move the electron probe into a starting position A.

In the comparative example, the positional deviation Δ has a magnitude equal to the product of the drift rate $\vec{D}$ and the time $(T_L \times N_L + T_I)$ taken to acquire one STEM image as represented by Eq. (4).

In contrast, in the image acquisition method for use in the electron microscope 100, the positional deviation Δ has a magnitude equal to the product of the drift rate $\vec{D}$ and the time $(T_L)$ taken to draw one scan line L as represented by Eq. (1). In this way, with the image acquisition method for use in the electron microscope 100, the positional deviation Δ can be reduced.

Where the positional deviation between two images is small, the positional deviation can be found more accurately than the case where the positional deviation between two images is larger. For example, in the case of periodic images such as atomic resolution images (lattice images), if the positional deviation between them is large, it is difficult to find the positional deviation accurately. In contrast, if the positional deviation between two images is small, the positional deviation can be found accurately provided that the images are periodic images such as atomic resolution images (lattice images). For example, in the case of lattice images, the positional deviation can be found easily and accurately by making the positional deviation less than one lattice period.

In the image acquisition method for use in the electron microscope 100, the positional deviation between the first STEM image I1 and the second STEM image I2 is corrected by the use of an indicium closest to the portion of the second STEM image I2 generated by drawing the initial scan line $L_1$. Therefore, the positional deviation can be made smaller than in the comparative example and can be found accurately and thus corrected accurately. With the image acquisition method for use in the electron microscope 100, if the images are periodic images such as atomic resolution images, the positional deviation can be corrected precisely.

Furthermore, where the positional deviation is corrected using the second half portion I1a of the first STEM image I1 and the first half portion I2a of the second STEM image I2, the positional deviation can be made smaller than in the comparative example and can be found more accurately for the following reason. In the equation representing the positional deviation in the first half portion I1a of the second STEM image I2, the drift rate $\vec{D}$ is multiplied by a value that is smaller than the time $(T_L \times N_L + T_I)$ taken to acquire one STEM image.

The image acquisition method for use in the electron microscope 100 includes the operational step of superimposing the first STEM image I1 and the second STEM image I2 over each other. During this operational step, an amount of drift is computed based on the first STEM image I1 and the second STEM image I2. The distortions in the first STEM image I1 and the second STEM image I2 are corrected based on the amount of drift. Therefore, the image acquisition method for use in the electron microscope 100 can reduce the effects of distortions caused by image drifting. Hence, the first STEM image I1 and the second STEM image I2 can be superimposed over each other at high accuracy.

In the comparative example, for example, if the first STEM image I1D and the second STEM image I2D drift, relative positions of points within each image deviate as given by $$\vec{P} = \vec{P}_0 + \vec{D} \times T_L \times P_y \qquad (5)$$

The deviations of the relative positions of points within an image as represented in Eq. (5) appear as a distortion of the image. Accordingly, if the first STEM image I1D and the second STEM image I2D are superimposed over each other, a high quality image is not obtained.

In contrast, in the image acquisition method for use in the electron microscope 100, distortions in the first and second STEM images I1 and I2, respectively, can be corrected based on these two STEM images derived with the electron probe scanned in mutually opposite directions as described above. Consequently, a high quality STEM image (accumulation image) can be obtained.

5. Modified Embodiments

It is to be understood that the present invention is not restricted to the foregoing embodiments and that the invention can be practiced in various modified forms without departing from the gist of the invention.

5.1. First Modified Embodiment

In the above embodiments, two STEM images, i.e., the first STEM image I1 and the second STEM image I2, are obtained and superimposed over each other. Alternatively, three or more STEM images may be obtained and superimposed over each other.

In this case, there is an additional operational step of obtaining a third STEM image (one example of a third scanned image) next to the second STEM image I2. In this step, each scan line L is drawn with an electron probe in the positive X direction and then moved in the positive Y direction, in the same way as for the first STEM image I1. There is a further operational step of superimposing the third STEM image over the other image (such as the accumulation image made up of the first STEM image I1 and the second STEM image I2). During this step, the positional deviation is corrected using the first half portion of the third STEM image and the second half portion of the other image.

In a still other operational step, a fourth STEM image is acquired next to the third STEM image. During this step, each scan line L is drawn with the electron probe in the positive X direction and then moved in the negative Y direction, in the same manner as for the second STEM image I2. In a yet other step, the fourth STEM image is superimposed over other image (such as an image of superimposed first through third STEM images). In this step, the positional deviation is corrected using a first half portion of the fourth STEM image and a second half portion of the other image. Furthermore, distortions can be corrected using the third and fourth STEM images.

In this way, during the operational step of acquiring each odd-numbered STEM image, each scan line L is drawn with the electron probe in the positive X direction and then moved in the positive Y direction. During the step of acquiring each even-numbered STEM image, each scan line L is drawn with the electron probe in the positive X direction and then moved in the negative Y direction.

In the operational step of superimposing one STEM image just acquired with other image already acquired, the positional deviation is corrected using a first half portion of the just acquired STEM image and a second half portion of the other image.

In addition, an amount of drift can be found using odd-numbered and even-numbered STEM images derived in succession, and distortions in these STEM images can be corrected based on the amount of drift.

The first modified embodiment can produce advantageous effects similar to those provided by the above-described image acquisition method for use in the electron microscope 100. Additionally, more images can be accumulated than in the foregoing embodiments and so the image quality can be improved further.

5.2. Second Modified Embodiment

In the above embodiments, the positional deviation between the first STEM image I1 and the second STEM image I2 is corrected by the use of the second half portion I1a of the first STEM image I1 and the first half portion I2a of the second STEM image I2. Alternatively, as illustrated in FIG. 10, the first STEM image I1 may be divided into four equal parts (quarters) along the Y axis and similarly the second STEM image I2 may be divided into four equal parts (quarters) along the Y axis. The positional deviation between the first STEM image I1 and the second STEM image I2 may be corrected using the final quarter I1b of the first STEM image I1 and the initial quarter I2b of the second STEM image I2. Consequently, the positional deviation can be made smaller than where the second half portion I1a of the first STEM image I1 and the first half portion I2a of the second STEM image I2 are used. The positional deviation can be found more accurately.

5.3. Third Modified Embodiment

In the above-described embodiments, the electron microscope 100 is a scanning transmission electron microscope. No restrictions are imposed on the type of the electron microscope 100 as long as it scans an electron probe and produces scanned images. The electron microscope 100 may be a scanning electron microscope, for example. In this case, scanned images are scanning electron microscope (SEM) images. If the electron microscope 100 is a scanning electron microscope, there accrue advantageous effects similar to those provided in the case where the electron microscope 100 is a scanning transmission electron microscope.

It is to be understood that the present invention is not restricted to the above embodiments and modifications thereof and that the invention can be practiced in further modified forms. For example, the present invention embraces configurations substantially identical (e.g., in function, method and results or in purpose and advantageous effects) to the configurations described in the above embodiments and modifications thereof. Furthermore, the present invention embraces configurations similar to the configurations described in the above embodiments and modifications thereof except that nonessential portions have been replaced. In addition, the present invention embraces configurations identical in advantageous effects or purpose to the configurations described in the above embodiments and modifications thereof. Further, the present invention embraces configurations similar to the configurations described in the above embodiments and modifications thereof except that a well-known technique is added.

What is claimed is:

1. An image acquisition method for use in an electron microscope for acquiring a scanned image by scanning a sample with an electron probe, said image acquisition method comprising the steps of:
   raster scanning a region of the sample under observation with the electron probe and obtaining a first scanned image;
   raster scanning the region under observation with the electron probe and obtaining a second scanned image; and
   superimposing the first and second scanned images over each other;
   wherein, in the step of obtaining the first scanned image, each scan line is drawn with the electron probe in a first direction and then moved in a second direction perpendicular to the first direction; and
   wherein, in the step of obtaining the second scanned image, each scan line is drawn with the electron probe in the first direction and then moved in a third direction opposite to the second direction.

2. An image acquisition method as set forth in claim 1, wherein the step of obtaining said first scanned image and the step of obtaining said second scanned image are performed in succession.

3. An image acquisition method as set forth in claim 1, wherein a time taken from when a final one of the scan lines is drawn in the step of obtaining said first scanned image to when an initial one of the scan lines is drawn in the step of obtaining said second scanned image is equal to a time taken from when each one of the scan lines is drawn until a next one is drawn in the step of obtaining the first scanned image.

4. An image acquisition method as set forth in claim 1, wherein, in the step of superimposing said first scanned image and said second scanned image over each other, a positional deviation between the first and second scanned images is corrected using both a second half portion of the first scanned image and a first half portion of the second scanned image.

5. An image acquisition method as set forth in claim 4, wherein, in the step of correcting said positional deviation, the positional deviation is corrected by searching the second half portion of said first scanned image and the first half portion of said second scanned image for positions of indicia indicative of the same position within said sample.

6. An image acquisition method as set forth in claim 5, wherein if said indicia are plural in number, there is used one of the indicia which is closest to a portion of said first scanned image generated by drawing a final one of the scan lines.

7. An image acquisition method as set forth in claim 1, wherein in the step of superimposing said first scanned image and said second scanned image over each other, the first and second scanned images are aligned relative to each other based on both a portion of the first scanned image generated by drawing a final one of the scan lines and a portion of the second scanned image generated by drawing an initial one of the scan lines.

8. An image acquisition method as set forth in claim 1, wherein, in the step of superimposing said first scanned image and said second scanned image over each other, an amount of drift is computed based on the first and second scanned images and distortions in the first and second scanned image are corrected based on the amount of distortion.

9. An image acquisition method as set forth in claim 1, further comprising the steps of:
   raster scanning said region under observation with said electron probe and obtaining a third scanned image after said step of obtaining said second scanned image; and
   superimposing said first scanned image, said second scanned image, and said third scanned image over each other;
   wherein, in the step of obtaining the third scanned image, each one of said scan lines is drawn with the electron probe in said first direction and then moved in said second direction.

10. An electron microscope for scanning a sample with an electron probe and acquiring a scanned image, said electron microscope comprising:
   an electron source emitting an electron beam;
   an illumination lens system for focusing the emitted electron beam into said electron probe;
   a deflector for deflecting the electron beam to scan the sample with the electron probe; and
   a controller performing processing to acquire the scanned image;
   wherein the controller is configured to perform the steps of: raster scanning a region of the sample under observation with the electron probe by deflecting the electron beam with the deflector to thereby obtain a first scanned image; raster scanning the region under observation with the electron probe by deflecting the electron beam with the deflector to thereby obtain a second scanned image; and superimposing the first and second scanned images over each other;
   wherein, in the step of obtaining the first scanned image, each one of the scan lines is drawn with the electron probe in a first direction and then moved in a second direction perpendicular to the first direction; and
   wherein, in the step of obtaining the second scanned image, each one of the scan lines is drawn with the electron probe in the first direction and then moved in a third direction opposite to the second direction.

* * * * *